(12) United States Patent
Talledo et al.

(10) Patent No.: US 9,818,675 B2
(45) Date of Patent: Nov. 14, 2017

(54) SEMICONDUCTOR DEVICE INCLUDING CONDUCTIVE CLIP WITH FLEXIBLE LEADS AND RELATED METHODS

(71) Applicant: STMICROELECTRONICS, INC., Calamba, Laguna (PH)

(72) Inventors: Jefferson Talledo, Laguna (PH); Ela Mia Cadag, Laguna (PH)

(73) Assignee: STMicroelectronics, Inc., Calamba, Laguna (PH)

( * ) Notice: Subject to any disclaimer, the term of this patent is extended or adjusted under 35 U.S.C. 154(b) by 0 days.

(21) Appl. No.: 14/674,069

(22) Filed: Mar. 31, 2015

(65) Prior Publication Data

US 2016/0293523 A1    Oct. 6, 2016

(51) Int. Cl.
*H01L 23/495* (2006.01)
*H01L 23/31* (2006.01)

(52) U.S. Cl.
CPC .. *H01L 23/49513* (2013.01); *H01L 23/49524* (2013.01); *H01L 23/49555* (2013.01); *H01L 23/49562* (2013.01); *H01L 23/3107* (2013.01); *H01L 2224/40* (2013.01); *H01L 2924/181* (2013.01)

(58) Field of Classification Search
CPC .......... H01L 23/49513; H01L 21/4825; H01L 21/565; H01L 23/3114; H01L 23/49541
See application file for complete search history.

(56) References Cited

U.S. PATENT DOCUMENTS

| | | | |
|---|---|---|---|
| 6,111,312 A | 8/2000 | Hirumuta et al. | |
| 6,462,424 B1 * | 10/2002 | Seki | H01L 21/4835 257/666 |
| 8,035,221 B2 | 10/2011 | Cruz | |
| 8,188,587 B2 | 5/2012 | Jereza | |
| 2002/0096756 A1 * | 7/2002 | Kobayakawa | H01L 23/3107 257/687 |
| 2005/0098872 A1 * | 5/2005 | Lien | H01L 23/3114 257/692 |
| 2008/0191324 A1 * | 8/2008 | Qiao | H01L 21/4828 257/666 |
| 2009/0057855 A1 * | 3/2009 | Quinones | H01L 23/49551 257/676 |
| 2010/0109135 A1 * | 5/2010 | Jereza | H01L 23/49524 257/676 |
| 2014/0291828 A1 * | 10/2014 | Yasunaga | H01L 23/49555 257/676 |

* cited by examiner

*Primary Examiner* — Peter Bradford
(74) *Attorney, Agent, or Firm* — Slater Matsil, LLP

(57) ABSTRACT

An integrated circuit (IC) device may include a leadframe and an IC die having a first surface coupled to the lead frame and a second surface opposite the first surface. The IC device may further include a conductive clip including a first portion coupled to the second surface of the IC die, a second portion coupled to the first portion and extending laterally away from the IC die, and at least one flexible lead coupled to the second portion and looping back under the second portion toward the leadframe. Furthermore, a package may be over the leadframe, IC die, and conductive clip and have an opening therein exposing the at least one flexible lead.

19 Claims, 6 Drawing Sheets

SEMICONDUCTOR DEVICE INCLUDING CONDUCTIVE CLIP WITH FLEXIBLE LEADS AND RELATED METHODS

TECHNICAL FIELD

The present invention relates to the field of electronic devices and, more particularly, to semiconductor devices and related methods.

BACKGROUND

Certain semiconductor devices are used in applications where relatively high current levels are required, such as in automotive applications, for example. With typical semiconductor devices, an integrated circuit die of the semiconductor device is interconnected with other components using wire bonds. However, in high current or high power applications, a relatively large number of bond wires may be required to carry the requisite current load. This may be problematic for device assembly in terms of complexity and spacing, for example. As such, some power semiconductor devices instead utilize a ribbon or clip interconnect to provide adequate current capacity for interconnections with other components.

Despite the existence of such configurations, further enhancements in power semiconductor devices may be desirable in certain applications for providing improved interconnections with other components.

SUMMARY

An integrated circuit (IC) device may include a leadframe, and an IC die having a first surface coupled to the lead frame and a second surface opposite the first surface. The IC device may further include a conductive clip including a first portion coupled to the second surface of the IC die, a second portion coupled to the first portion and extending laterally away from the IC die, and at least one flexible lead coupled to the second portion and looping back under the second portion toward the leadframe. Furthermore, a package may be over the leadframe, IC die, and conductive clip and have an opening therein exposing the at least one flexible lead.

More particularly, the at least one flexible lead may comprise a plurality of spaced apart flexible leads. The at least one flexible lead may have a thickness less than a thickness of the first and second portions of the conductive clip, for example. Furthermore, the at least one flexible lead may define a gap with an adjacent area of the second portion of the conductive clip. Additionally, the second portion may have a pair of opposing bends therein.

The leadframe may have a bottom surface that is flush with a bottom surface of the at least one flexible lead. Also, a first solder layer may couple the first surface of the IC die to the leadframe, and a second solder layer may couple the second surface of the IC die to the first portion of the conductive clip.

A related electronic device is also provided which may include an integrated circuit device, such as the one described briefly above, and a printed circuit board (PCB). The PCB may be electrically coupled to at least one flexible lead.

A related method is for making an integrated circuit (IC) device. The method may include coupling a first surface of an IC die to a leadframe, where the IC die also has a second surface opposite the first surface. Furthermore, a first portion of a conductive clip may be coupled to the second surface so that a second portion of the conductive clip coupled to the first portion extends laterally away from the IC die. The conductive clip may also have at least one flexible lead coupled to the second portion and looping back under the second portion toward the leadframe. The method may also include forming a package over the leadframe, IC die, and conductive clip and having an opening therein exposing the at least one flexible lead.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

Figure 1:
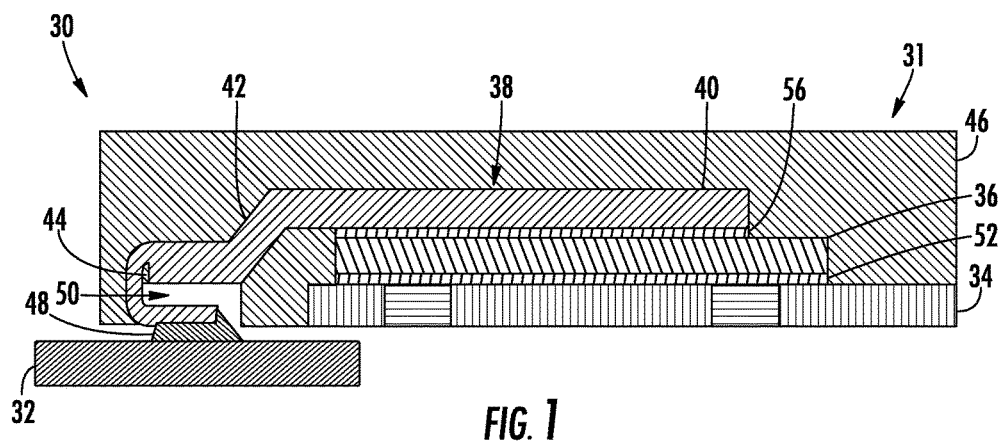
FIG. 1 is a cross-sectional diagram of an integrated circuit (IC) device including a conductive clip in accordance with an example embodiment.
Figure 2:
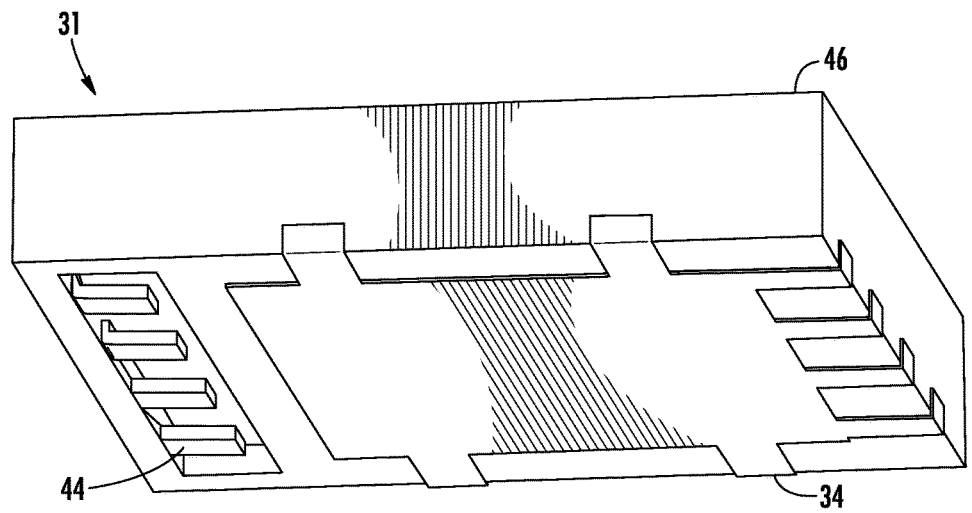
FIG. 2 is a bottom perspective view of the IC device of FIG. 1.

Referring initially to FIGS. 1 and 2, an electronic device 30 including an integrated circuit (IC) device 31 and a printed circuit board (PCB) 32 is first described. By way of background, a problem that may occur with typical ribbon or clip interconnect configurations in power semiconductor devices occurs with a solder connection between the clip and adjacent components, such as a PCB board, for example. In particular, such solder connections may be subject to early solder crack failure, resulting in low board level reliability (BLR) performance or solder joint reliability, for example.

The IC device 31 illustratively includes a leadframe 34 and an IC die 36 having a first surface coupled to the leadframe, and a second surface opposite the first surface. The IC device 31 further illustratively includes a conductive clip 38 including a first portion 40 coupled to the second surface of the IC die 36, a second portion 42 coupled to the first portion and extending laterally away from the IC die. In the illustrated example, the second portion 42 has a pair of opposing bends therein defining a step down in height from the top surface of the IC die 36, although other configurations may be used in different embodiments.

One or more flexible leads 44 are coupled to the second portion and loop back under the second portion toward the leadframe 34 as shown. In this regard, the flexible leads 44 have a thickness less than a thickness of the first and second portions 40, 42 of the conductive clip 38. Moreover, the flexible leads 44 define a gap 50 with an adjacent area of the second portion 42 of the conductive clip 38. In the illustrated embodiment, there are four flexible leads 44, although other numbers of flexible leads may be used in different embodiments depending on the given application.

Furthermore, a package 46 may be over the leadframe 34, IC die 36, and conductive clip 38 and have an opening therein exposing the flexible leads 44 at the bottom of the package. Moreover, the leadframe 34 illustratively has a bottom surface that is flush with a bottom surface of the flexible leads 44. The exposed flexible leads 44 may accordingly be coupled to the PCB 32 via solder layers 48. Each flexible lead 44 acts like a cantilever contact to the PCB 32, which helps reduce early solder joint failure. As noted above, using the conductive clip 38 attachment instead of several wire bonds to couple the die 40 advantageously helps accommodate high current/high power applications, such as automotive applications, for example. Interconnection of the package 46 to the PCB 32 is therefore not only flexible, but the leads 44 are an integral part of the clip which allows them to be strongly anchored to the molding compound of the package body. High BLR performance may thereby be achieved without the above-noted lead pull issues.

Figure 3:
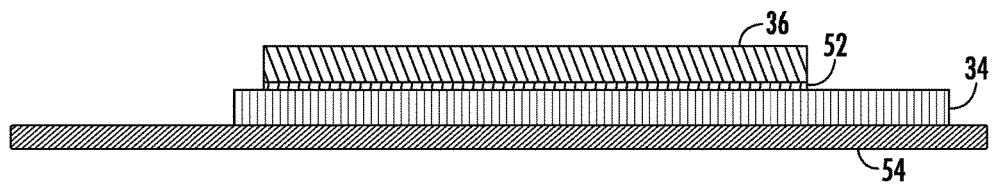
FIG. 3 is cross-sectional view illustrating a first step in a method for making an IC device in accordance with an example embodiment.
Figure 4:
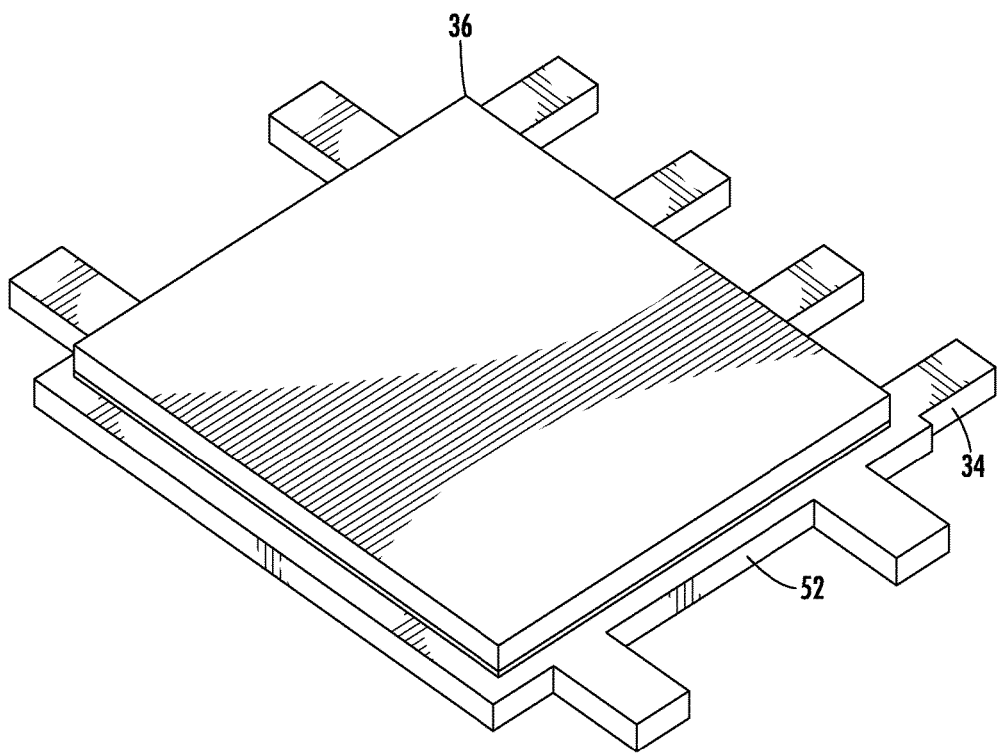
FIG. 4 is a perspective view corresponding to FIG. 3.
Figure 5:
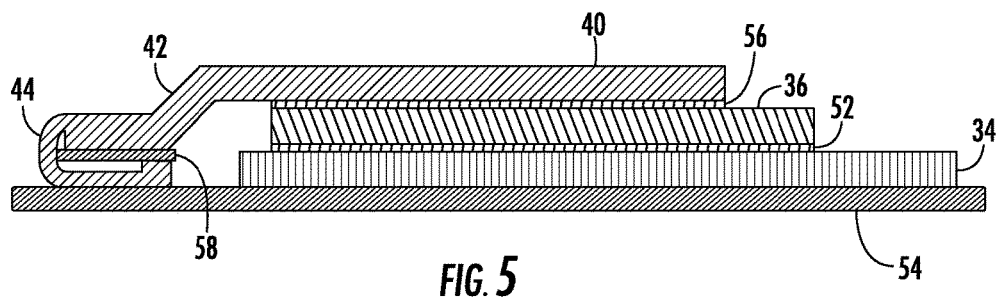
FIG. 5 is cross-sectional view illustrating a second step in the method.
Figure 6:
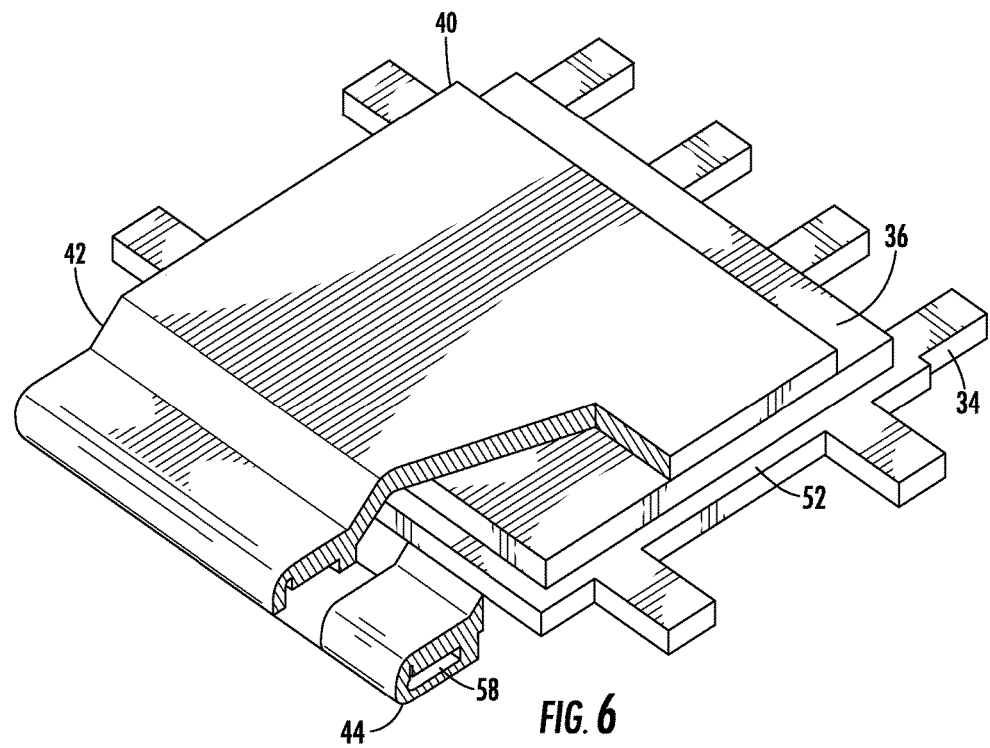
FIG. 6 is a perspective view corresponding to FIG. 5.

A related method for making the IC device 31 is now described with reference to FIGS. 3-10. The method may include coupling or bonding a first (bottom) surface of the IC die 36 to the leadframe 34 with a first solder layer 52 (e.g., soft solder/Ag sintering), as seen in FIGS. 3 and 4. The leadframe 34 may be carried by a substrate 54 during processing. The first portion 40 of the conductive clip 38 may be coupled to the second (upper) surface of the IC die 36 with a second solder layer 56 (e.g., soft solder/Ag sintering), as seen in FIGS. 5 and 6. Temporary carrier tape 58 may be pre-positioned in the gap 50 between the flexible leads 44 (there are two leads in the illustrated example) and the bottom of the second portion 42, if desired.

Figure 7:
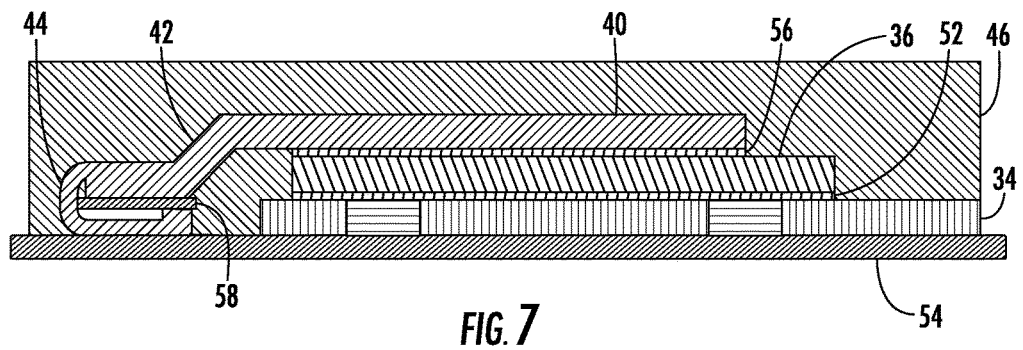
FIG. 7 is cross-sectional view illustrating a third step in the method.
Figure 8:
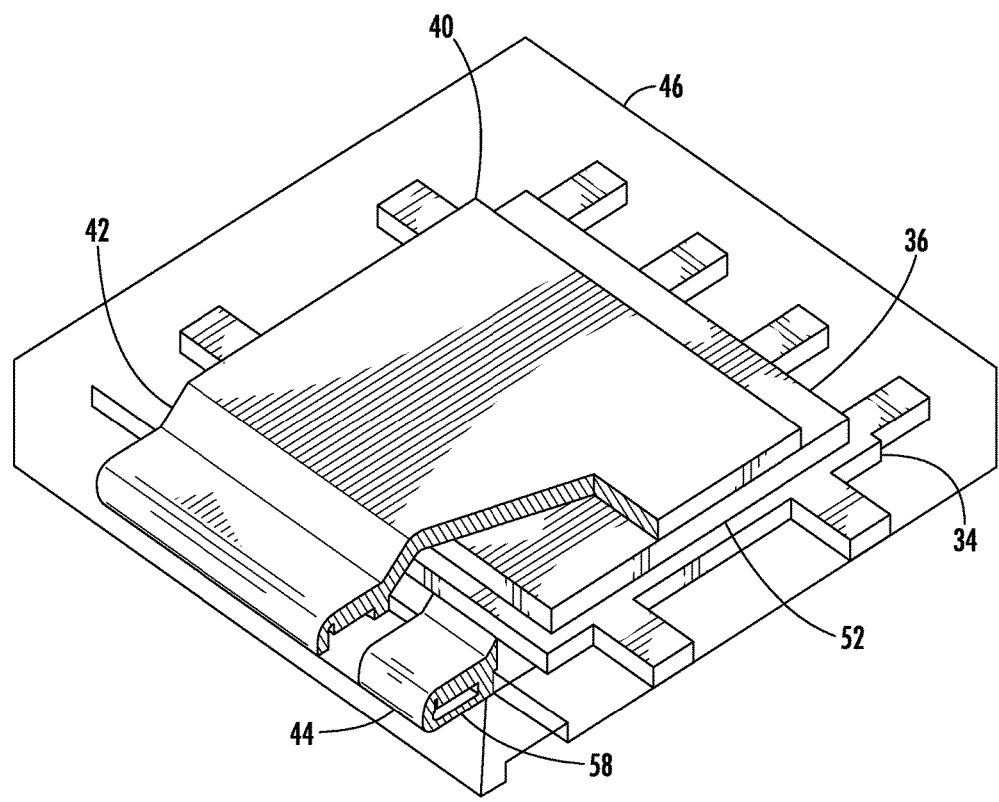
FIG. 8 is a perspective view corresponding to FIG. 7.
Figure 9:
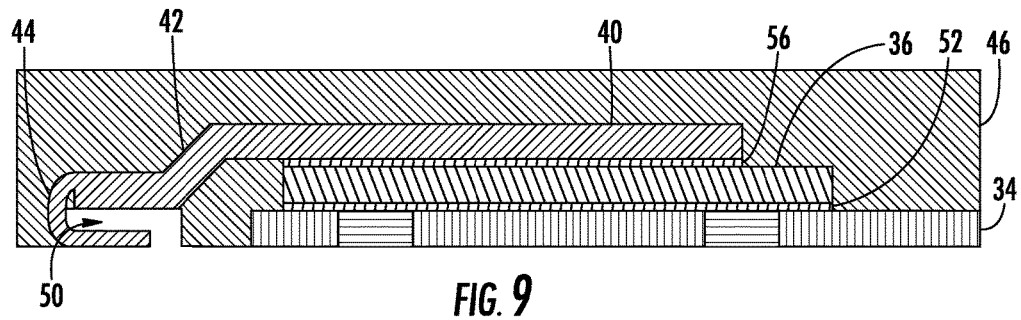
FIG. 9 is cross-sectional view illustrating a fourth step in the method.
Figure 10:
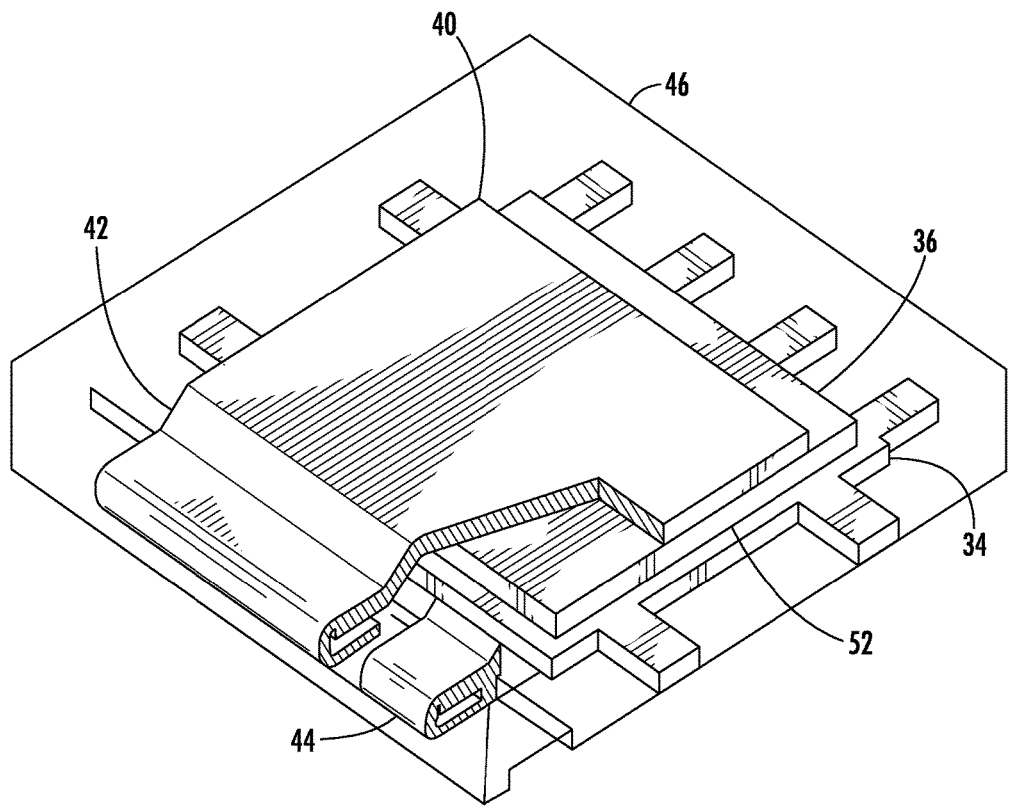
FIG. 10 is a perspective view corresponding to FIG. 9.

The method may also include encapsulating the package 46 over the leadframe 34, IC die 36, and conductive clip 38, as seen in FIGS. 7 and 8. The IC device 31 may be separated from the substrate 34, and then the bottom portion of the package 46 may be etched to expose the flexible leads 44 and the temporary carrier tape 58 removed, as seen in FIGS. 9 and 10. It should be noted that in FIGS. 6, 8, and 10, a portion of the conductive clip 38 has been cut away for illustrational purposes. Moreover, the flexible leads 44 have different widths, rather than uniform widths as in FIG. 2.

Figure 11:
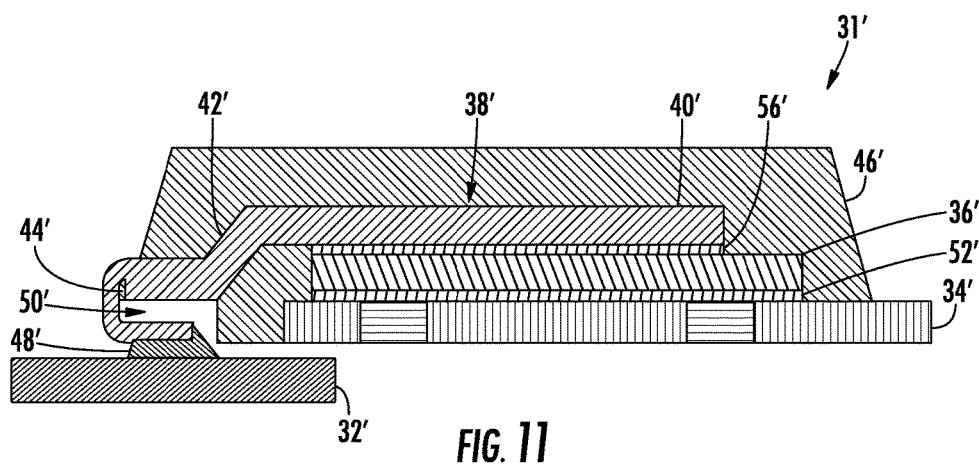
FIG. 11 is a cross-sectional diagram of an IC device including a conductive clip in accordance with another example embodiment.

In accordance with another example embodiment illustrated in FIG. 11, an IC device 31' has an individual cavity mold style package 46', as will be appreciated by those skilled in the art. The remaining components of this configuration are similar to those described above with respect to FIG. 1, and therefore are not described again here. By way of example, the IC devices 31, 31' may be well suited for applications such as the PowerFLAT™ family of devices from Applicant STMicroelectronics, as well as quad flat no-lead (QFN) type IC packages used for automotive/power applications, etc. However, other configurations may also be used.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
    a leadframe;
    a semiconductor die having a first surface coupled to the leadframe, and a second surface opposite the first surface;
    a conductive clip comprising:
        a first portion coupled to the second surface of the semiconductor die,
        a second portion coupled to the first portion and extending laterally away from the semiconductor die, and
        a flexible lead coupled to the second portion and looping back under the second portion toward the leadframe; and
    a package encapsulating the semiconductor die, and the conductive clip except for an opening in a bottom thereof exposing the flexible lead only at the bottom of the package, wherein the package has an inner portion inside the flexible lead extending to a lowermost surface of the flexible lead, and an outer portion outside the flexible lead also extending to the lowermost surface of the flexible lead.

2. The semiconductor device of claim 1 wherein the flexible lead comprises one of a plurality of spaced apart flexible leads coupled to the second portion and looping back under the second portion toward the leadframe.

3. The semiconductor device of claim 1 wherein the flexible lead has a thickness less than a thickness of the first and second portions of the conductive clip.

4. The semiconductor device of claim 1 wherein the flexible lead defines a gap with an adjacent area of the second portion of the conductive clip.

5. The semiconductor device of claim 1 wherein the second portion has a pair of opposing bends therein.

6. The semiconductor device of claim 1 wherein the leadframe has a bottom surface that is flush with a bottom surface of the flexible lead.

7. The semiconductor device of claim 1 further comprising a first solder layer coupling the first surface of the semiconductor die to the leadframe.

8. The semiconductor device of claim 1 further comprising a second solder layer coupling the second surface of the semiconductor die to the first portion of the conductive clip.

9. An electronic device comprising:
    the semiconductor device of claim 1; and
    a printed circuit board (PCB) electrically coupled to the flexible lead.

10. A method for making a semiconductor device comprising:
    coupling a first surface of an semiconductor die to a leadframe, the semiconductor die also having a second surface opposite the first surface;
    coupling a first portion of a conductive clip to the second surface of the semiconductor die so that a second portion of the conductive clip coupled to the first portion extends laterally away from the semiconductor die, the conductive clip also having a flexible lead coupled to the second portion and looping back under the second portion toward the leadframe;

forming a package over the leadframe, semiconductor die, and conductive clip so that the leadframe, semiconductor die, and conductive clip are not exposed outside the package; and etching an opening in a bottom of the package exposing the flexible lead only at the bottom of the package.

11. The method of claim 10 wherein the flexible lead comprises a plurality of spaced apart flexible leads.

12. The method of claim 10 wherein the flexible lead has a thickness less than a thickness of the first and second portions of the conductive clip.

13. The method of claim 10 wherein the flexible lead defines a gap with an adjacent area of the second portion of the conductive clip.

14. The method of claim 10 wherein the second portion has a pair of opposing bends therein.

15. The method of claim 10 wherein the leadframe has a bottom surface that is flush with a bottom surface of the flexible lead.

16. The method of claim 10 wherein coupling the first surface of the semiconductor die to the leadframe comprises coupling the first surface of the semiconductor die to the leadframe with a first solder layer.

17. The method of claim 10 wherein coupling the second surface of the semiconductor die to the first portion of the conductive clip comprises coupling the second surface of the semiconductor die to the first portion of the conductive clip with a second solder layer.

18. The semiconductor device of claim 1, wherein the first portion of the conductive clip is coupled to the semiconductor die without wire by having an overlapping region of the first portion that overlaps the conductive clip being soldered to the semiconductor die.

19. The semiconductor device of claim 18, wherein the overlapping region is soldered to the semiconductor die with a solder layer applied between a lower surface of the overlapping region of the first portion of the conductive clip and an upper surface of the semiconductor die.

* * * * *